US010636879B2

(12) United States Patent
Rao

(10) Patent No.: US 10,636,879 B2
(45) Date of Patent: Apr. 28, 2020

(54) METHOD FOR MAKING DRAM WITH RECESSED CHANNEL ARRAY TRANSISTOR (RCAT) INCLUDING A SUPERLATTICE

(71) Applicant: ATOMERA INCORPORATED, Los Gatos, CA (US)

(72) Inventor: Kalipatnam Vivek Rao, Grafton, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 44 days.

(21) Appl. No.: 16/007,186

(22) Filed: Jun. 13, 2018

(65) Prior Publication Data

US 2018/0358361 A1 Dec. 13, 2018

Related U.S. Application Data

(60) Provisional application No. 62/518,853, filed on Jun. 13, 2017.

(51) Int. Cl.
*H01L 29/15* (2006.01)
*H01L 27/108* (2006.01)
(Continued)

(52) U.S. Cl.
CPC ...... *H01L 29/152* (2013.01); *H01L 27/10814* (2013.01); *H01L 27/10823* (2013.01);
(Continued)

(58) Field of Classification Search
CPC ............... H01L 29/152; H01L 29/1037; H01L 29/7825; H01L 29/66704; H01L 29/15;
(Continued)

(56) References Cited

U.S. PATENT DOCUMENTS 4,937,204 A 6/1990 Ishibashi et al.
5,216,262 A 6/1993 Tsu
(Continued)

FOREIGN PATENT DOCUMENTS

GB 2347520 6/2000

OTHER PUBLICATIONS

U.S. Appl. No. 15/664,028, filed Jul. 31, 2017 Mears et al.
(Continued)

*Primary Examiner* — William F Kraig
*Assistant Examiner* — Vicki B. Booker
(74) *Attorney, Agent, or Firm* — Allen, Dyer, Doppelt + Gilchrist, P.A. Attorneys at Law

(57) ABSTRACT

A method for making a semiconductor device may include forming at least one memory array including a plurality of recessed channel array transistors (RCATs) on a substrate, and forming periphery circuitry adjacent the at least one memory array and comprising a plurality of complementary metal oxide (CMOS) transistors on the substrate. Each of the CMOS transistors may include spaced-apart source and drain regions in the substrate and defining a channel region therebetween, and a first superlattice extending between the source and drain regions in the channel region. The first superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. A gate may be over the first superlattice and between the source and drain regions.

25 Claims, 17 Drawing Sheets

(51) Int. Cl.
*H01L 29/423* (2006.01)
*H01L 29/10* (2006.01)
*H01L 29/78* (2006.01)
*H01L 29/66* (2006.01)
*H01L 29/08* (2006.01)
*H01L 29/12* (2006.01)
*H01L 21/02* (2006.01)

(52) U.S. Cl.
CPC .. *H01L 27/10876* (2013.01); *H01L 27/10888* (2013.01); *H01L 27/10894* (2013.01); *H01L 27/10897* (2013.01); *H01L 29/0847* (2013.01); *H01L 29/1033* (2013.01); *H01L 29/1037* (2013.01); *H01L 29/1054* (2013.01); *H01L 29/15* (2013.01); *H01L 29/4236* (2013.01); *H01L 29/66621* (2013.01); *H01L 29/66704* (2013.01); *H01L 29/7825* (2013.01); *H01L 29/7833* (2013.01); *H01L 21/02507* (2013.01); *H01L 29/122* (2013.01)

(58) Field of Classification Search
CPC ............. H01L 29/1033; H01L 29/0847; H01L 27/10888; H01L 29/1054; H01L 27/10894; H01L 29/4236; H01L 27/10823; H01L 27/10814; H01L 27/10876; H01L 27/10897; H01L 21/02507; H01L 29/122; H01L 29/7833; H01L 29/66621
See application file for complete search history.

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 * | 12/2004 | Mears | B82Y 10/00 257/E21.633 |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 2003/0034529 A1 | 2/2003 | Fitzgerald et al. | |
| 2003/0057416 A1 | 3/2003 | Currie et al. | |
| 2005/0095794 A1 * | 5/2005 | Park ................. | H01L 27/10876 438/296 |
| 2006/0220118 A1 | 10/2006 | Stephenson et al. | |
| 2006/0267130 A1 | 11/2006 | Rao | |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0258134 A1 | 10/2008 | Mears et al. | |
| 2011/0215299 A1 | 9/2011 | Rao | |
| 2015/0357414 A1 | 12/2015 | Mears | |
| 2016/0099317 A1 | 4/2016 | Mears et al. | |
| 2016/0149023 A1 | 5/2016 | Mears et al. | |
| 2016/0336406 A1 | 11/2016 | Mears et al. | |
| 2016/0358773 A1 | 12/2016 | Mears et al. | |
| 2017/0018453 A1 | 1/2017 | Park | |
| 2017/0294514 A1 | 10/2017 | Mears | |
| 2017/0301757 A1 | 10/2017 | Mears et al. | |
| 2017/0330609 A1 | 11/2017 | Roy | |
| 2018/0040714 A1 | 2/2018 | Mears et al. | |
| 2018/0040724 A1 | 2/2018 | Mears et al. | |
| 2018/0040725 A1 | 2/2018 | Mears et al. | |
| 2018/0040743 A1 | 2/2018 | Mears et al. | |

OTHER PUBLICATIONS

U.S. Appl. No. 15/678,616, filed Aug. 16, 2017 Richard Stephen Roy.
U.S. Appl. No. 15/678,658, filed Aug. 16, 2017 Richard Stephen Roy.
U.S. Appl. No. 15/842,981, filed Dec. 15, 2017 Chen et al.
U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.
U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 15/980,893, filed May 16, 2018 Hideki Takeuchi.
U.S. Appl. No. 15/980,902, filed May 16, 2018 Hideki Takeuchi.
Kim et al. "The COB stack DRAM cell at technology node below 100 nm-scaling issues and directions" IEEE Trans. Semiconductor Manufacturing, 15(2), pp. 137-143. Abstract Only.
Luo et al., "Chemical Design of Direct-Gap Light-Emitting Silicon" published in Physical Review Letters, vol. 89, No. 7; Aug. 12, 2002; 4 pgs.

(56) References Cited

OTHER PUBLICATIONS

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Novikov et al. "Silicon-based Optoelectronics" 1999-2003, pp. 1-6.

R. Tsu Phenomena in silicon nanostructure device published online Sep. 6, 2000 by Applied Physics and Materials Science & Processing, pp. 391-402.

Raphael Tsu "Si Based Green ELD: Si-Oxygen Superlattice" wysiwyg://l/http://www3.interscience.wiley.com/cgi-bin/abstract/72512946/ start: published online Jul. 21, 2000; 2 pgs. Abstract Only.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

U.S. Appl. No. 16/007,209, filed Jun. 13, 2018 Kalipatnam Vivek Rao.

Kim et al. Overcoming DRAM Scaling Limitations by Employing Straight Recessed Channel Array Transistors with <100> Uni-Axial and {100} Uni-Plane Channels; Samsung Electronics, IEDM Tech. Digest 2005; pp. 4.

Sayama et al. "Effect of <100> Channel Direction for High Performance SCE Immune pMOSFET with Less Than 0.15um Gate Length" IEDM Tech. Digest 1999; pp. 4.

Kim et al "The COB Stack DRAM Cell at Technology Node Below 100 nm-Scaling Issues and Directions" IEEE Transactions on Semiconductor Manufacturing, vol. 15, No. 2, May 2002; pp. 7.

\* cited by examiner

| MODULE | PROCESS STEP | WHITE= PROCESSED GREY= PROTECTED ARRAY | PERIPHERY | NOTES |
|---|---|---|---|---|
| MST-1 MODULE | MST-1 FILM GROWTH | | | |
| STI MODULE | | | | |
| RECESS GATE MODULE | | | ///// | |
| RECESS GATE MODULE | SACRIFICIAL OXIDATION | | ///// | |
| MST-2 MODULE | MEARS PRE-CLEAN | | | WET CLEAN: SC1/DHF (STRIP SAC OX, AND PREPARE SURFACE FOR MST-2 FILM) |
| MST-2 MODULE | MEARS FILM-2 DEP | | | GROW MST-2 FILM<br>ARRAY: TRENCHES (SILICON & STI SIDEWALLS), PLANAR, S/D, STI<br>PERIPHERY: STI, AA PAD OX |
| MST-2 MODULE | TEOS DEP | | | TEOS DEP (100A) TP PROTECT TRENCH FROM HDP DAMAGE (NEXT STEP) |
| MST-2 MODULE | DEPOSIT HDP OXIDE | | | PROTECT MST-2 FILM-IN PASS GATE TRENCHES.<br>THICKNESS: ~2.5K-3K A |
| MST-2 MODULE | DENSIFICATION ANNEAL | | | DENSIFY HDP OXIDE TO MAKE IT RESISTANT TO WET ETCHES |
| MST-2 MODULE | CMP | | | CMP OXIDE & MST SILICON ON PLANAR SURFACE (STOP ON NITRIDE) |
| MST-2 MODULE | SiN DEP | | | HARD-MASK NITRIDE (400-500A) FOR SLOT ETCH<br>(RECESS GATE: SiN DEP ON HDP OXIDE;<br>ELSEWHERE: SiN DEP ON EXISTING SiN) |
| MST-2 MODULE | LITHO | | ///// | SLOT MASK- NESTED INSIDE ARRAY GATE (PERIPHERY CLOSED) |
| MST-2 MODULE | SLOT ETCH | | ///// | PLASMA ETCH HARD MASK NITIDE &<br>PLASMA ETCH OXIDE IN RECESS GATE TRENCH (TIMED ETCH, TO LEAVE 200A OXIDE ON MEARS FILM AT BOTTOM OF TRENCH. |
| MST-2 MODULE | STRIP RESIST | | | |
| RECESS GATE | SiN WET STRIP | | | |
| MST-2 MODULE | WET ETCH Si | | | WET ETCH SILICON (NH4OH: H2O) TO REMOVE MEARS POLY FILM ON STI SIDEWALLS IN SLOTS AND ON SURFACE |
| RECESS GATE | WET ETCH OXIDE | | | ADJUST WET ETCH TIME TO ENSURE ALL SAC OXIDE IS REMOVED ON SURFACE AND IN ARRAY GATE TRENCH BOTTOM |
| RECESS GATE | SCREEN OXIDE | | | SCREEN OXIDE FOR IMPLANTS |
| WELL & CHANNEL | | | | |
| GATE OXIDE MODULE | | | | |

FIG. 11

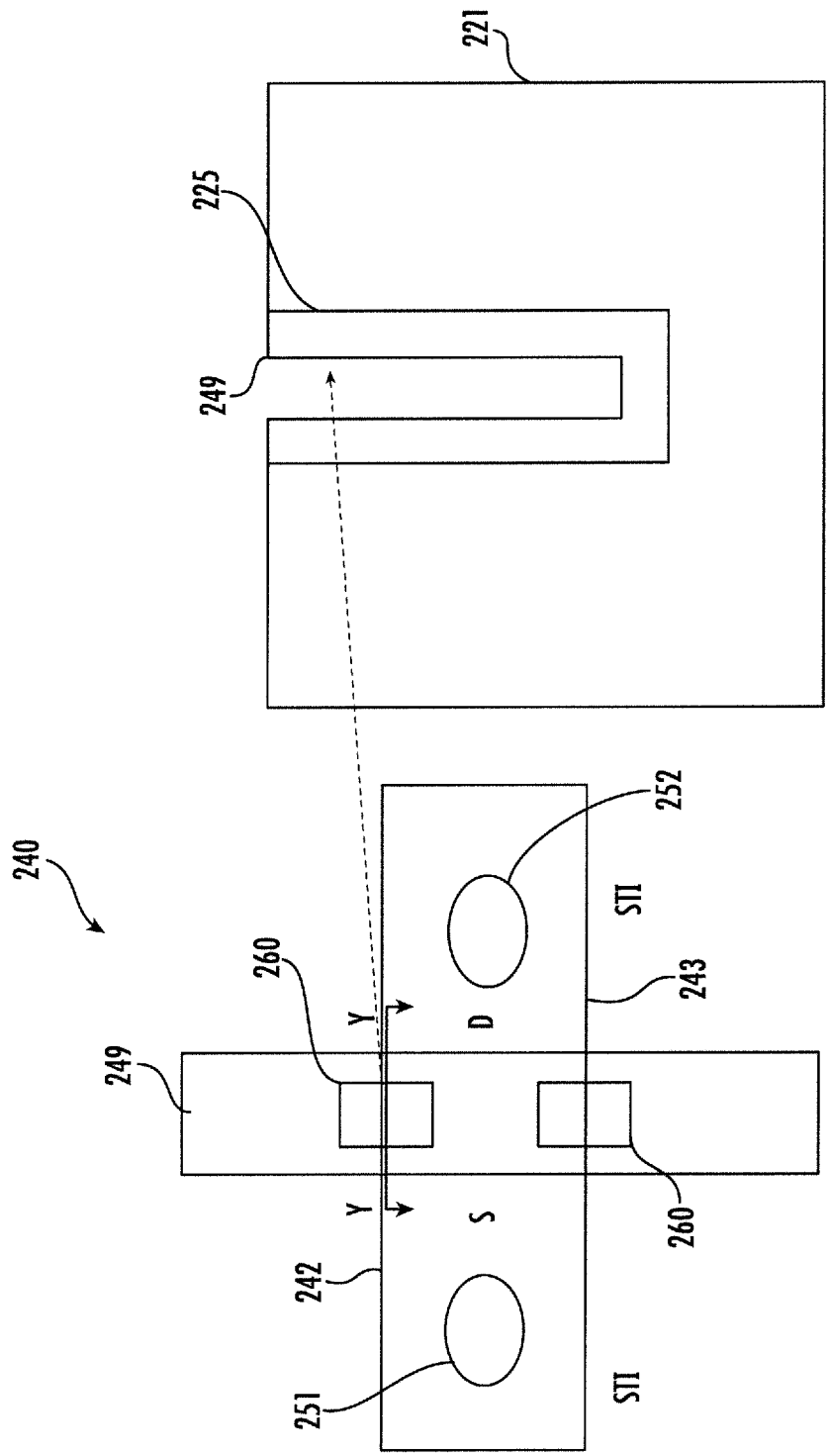

| MODULE | PROCESS STEP | ARRAY | PERIPHERY | NOTES |
|---|---|---|---|---|
| | | WHITE = PROCESSED GREY = PROTECTED | | |
| STI MODULE | | | | |
| STI | PAD OXIDATION | | | DETAILS? |
| STI | SiN DEP | | | |
| STI | LITHO | | | AA LITHO |
| STI | SiN DRY ETCH | | | HARD MASK ETCH |
| STI | TEOS NSG DEP | | | SIDEWALL OXIDE FORMATION FOR SiN |
| STI | Si DRY ETCH | | | DEPTH = 200nm |
| STI | OXIDATION | | | LINER, ISSG 1100C, 13nm |
| STI | HDP OXIDE DEP | | | |
| STI | STI OXIDE CMP | | | |
| STI | OX WET ETCH | | | |
| STI | SiN WET STRIP | | | |
| STI | REOXIDATION | | | |
| RECESS GATE | LITHO | | ///// | PERIPHERY PROTECTED |
| RECESS GATE | SiN DRY ETCH | | ///// | |
| RECESS GATE | SiN SW DEP | | ///// | |
| RECESS GATE | Si DRY ETCH | | ///// | 140nm. MEARS FILM ETCHED OFF FROM RECESSED GATE TRENCH |
| RECESS GATE MODULE | SACRIFICIAL OXIDATION | | ///// | AT THE END OF RECESS GATE MODULE, NITRIDE IS PROTECTING PLANAR SURFACE IN ARRAY AND PERIPHERY |
| MST-1 MODULE | NITRIDE STRIP | | | WET STRIP NITRIDE IN H3PO4 |
| MST-1 MODULE | MST PRE-CLEAN | | | WET CLEAN: SC1/DHF (STRIP SAC OX & PAD OX, AND PREPARE SURFACE FOR MST-1 FILM) |
| MST-1 MODULE | MST-1 FILM DEP | | | GROW EPITAXIAL MST-1 FILM ARRAY: RCAT TRENCHES (SILICON & STI SIDEWALLS), PLANAR: S/D, STI PERIPHERY: STI, AA |
| MST-1 MODULE | MST PAD OXIDE | | | THERMAL OXIDE (850C, WET O2, 100A) |
| MST-1 MODULE | DEPOSIT NITRIDE | | | LPCVD NITRIDE (500A) |
| MST-1 MODULE | RCAT PATTERN | | ///// | OVERSIZED RCAT PATTERN (OPEN UP RCAT TRENCH AREA, PROTECT ARRAY PLANAR SURFACE & PERIPHERY) |
| MST-1 MODULE | NITRIDE ETCH | | ///// | PLASMA ETCH NITRIDE IN RCAT TRENCHES & STRIP RESIST |
| MST-1 MODULE | DEPOSIT HDP OXIDE | | | PROTECT MST-1 FILM IN RCAT TRENCHES. THICKNESS: ~2.5K-3K A |
| MST-1 MODULE | DENSIFICATION ANNEAL | | | DENSIFY HDP OXIDE TO MAKE IT RESISTANT TO WET ETCHES |
| MST-1 MODULE | CMP OXIDE | | | CMP OXIDE ON PLANAR SURFACE (STOP ON NITRIDE IN PERIPHERY & ARRAY). RCAT IS FILLED WITH HDP OXIDE. SHOULD HAVE SELECTIVITY TO NITRIDE |
| MST-1 MODULE | CMP NITRIDE | | | CMP NITRIDE (SELECTIVITY TO OXIDE) |
| MST-1 MODULE | ETCH OXIDE & MST | | | WET ETCH OXIDE (DHF)- CONTROLLED DEPTH IN RCAT & WET ETCH SILICON (TO GET RID OF PARASITIC MST IN RCAT & ON STI) |
| MST-1 MODULE | TAB OXIDATION | | | THERMAL OXIDATION (850C, WET O2, 150A) TO OXIDIZE EDGES OF MST TAB AT AA EDGES. ALSO OXIDIZES MST IN RCAT TRENCHES & PROVIDES PROTECTION AGAINST WET NITRIDE & SILICON ETCHES IN NEXT STEPS |
| MST-1 MODULE | NITRIDE STRIP | | | WET STRIP NITRIDE IN H3PO4 (TO REMOVE NITRIDE FROM AA) |
| MST-1 MODULE | WET ETCH Si | | | WET ETCH SILICON (NH4OH:H2O) TO REMOVE MST FROM STI SURFACE |
| RECESS GATE | WET ETCH OXIDE | | | ADJUST WET ETCH TIME TO ENSURE ALL SAC OXIDE IS REMOVED ON SURFACE AND IN ARRAY RCAT TRENCH BOTTOM |
| RECESS GATE | SCREEN OXIDE | | | GROW SCREEN OXIDE FOR IMPLANTS |
| WELL & CHANNEL IMPLANTS | | | | |

FIG. 16

METHOD FOR MAKING DRAM WITH RECESSED CHANNEL ARRAY TRANSISTOR (RCAT) INCLUDING A SUPERLATTICE

RELATED APPLICATIONS

This application claims the benefit of provisional application Ser. No. 62/518,853 filed Jun. 13, 2017, which is hereby incorporated herein in its entirety by reference.

TECHNICAL FIELD

The present invention relates to the field of semiconductors, and, more particularly, to semiconductor devices including enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in memory devices such as dynamic random access memory (DRAM) memory cells, for example.

SUMMARY

A method for making a semiconductor device may include forming at least one memory array including a plurality of recessed channel array transistors (RCATs) on a substrate, and forming periphery circuitry adjacent the at least one memory array and including a plurality of complementary metal oxide (CMOS) transistors on the substrate. Each of the CMOS transistors may include spaced-apart source and drain regions in the substrate and defining a channel region therebetween, and a first superlattice extending between the source and drain regions in the channel region. The first superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. A gate may be over the first superlattice and between the source and drain regions.

Furthermore, each of the RCATs may include spaced-apart source and drain regions in the substrate, a recessed gate in the substrate between the source and drain regions, and a second superlattice along bottom and sidewall portions of the recessed gate and defining a channel of the RCAT. The second superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions.

In accordance with one example, the method may further include forming the second superlattice using a slot mask. The second superlattice on the sidewall portions of the recessed gate may terminate below the source and drain regions in one example embodiment. The method may also include forming a stacked capacitor contact on the source region of each RCAT, and forming a bitline contact on the drain region.

The at least one memory array may comprise a plurality of spaced apart memory arrays, and the periphery circuitry may surround the plurality of spaced apart memory arrays. By way of example, the base semiconductor monolayers may comprise silicon monolayers, and the at least one non-semiconductor monolayer may comprise oxygen.

BRIEF DESCRIPTION OF THE DRAWINGS

FIG. 11 is a table including further example process details which may be used in the method of FIG. 8.

FIG. 12A is a top view of the RCAT of FIG. 10 after removal of the semiconductor material from the RCAT trenches.

FIG. 12B is cross-sectional diagram taken along the line Y-Y in FIG. 12A.

FIG. 16 is a table illustrating further method aspects which may be used in the method of FIG. 15 in accordance with an example implementation.

DETAILED DESCRIPTION

Figure 1:
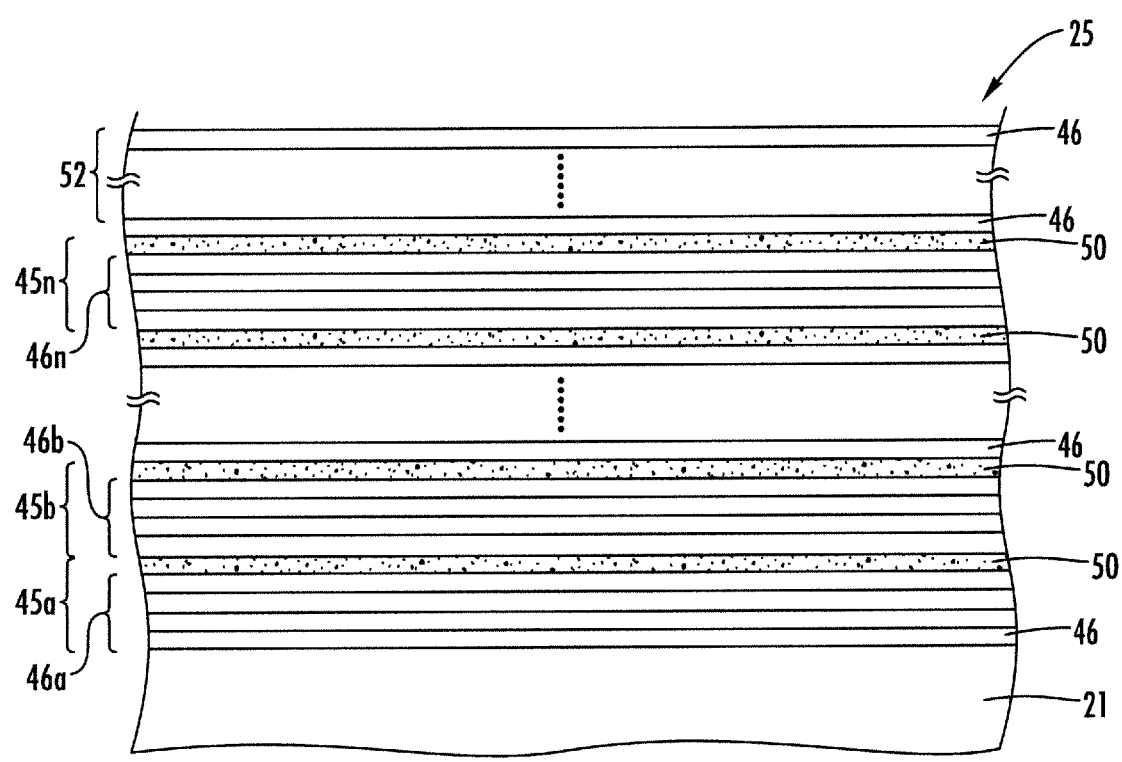
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor, Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
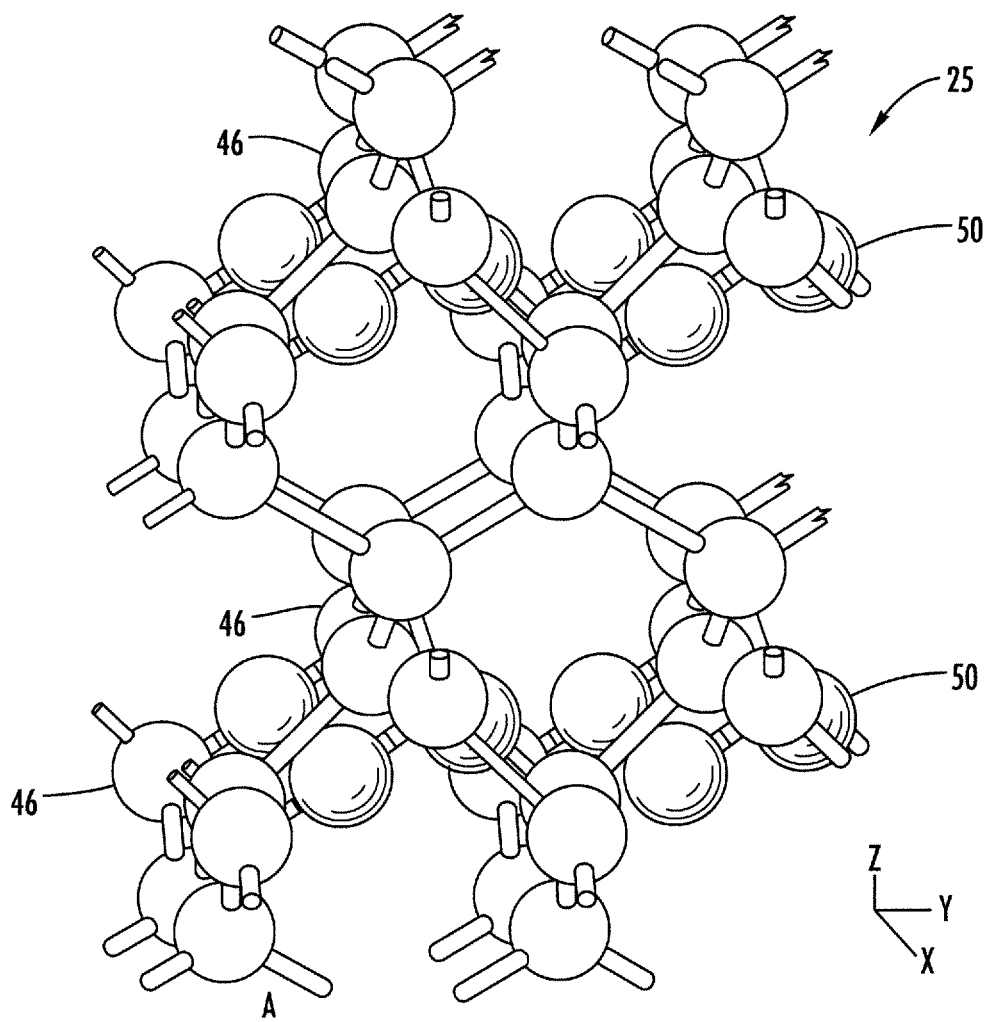
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
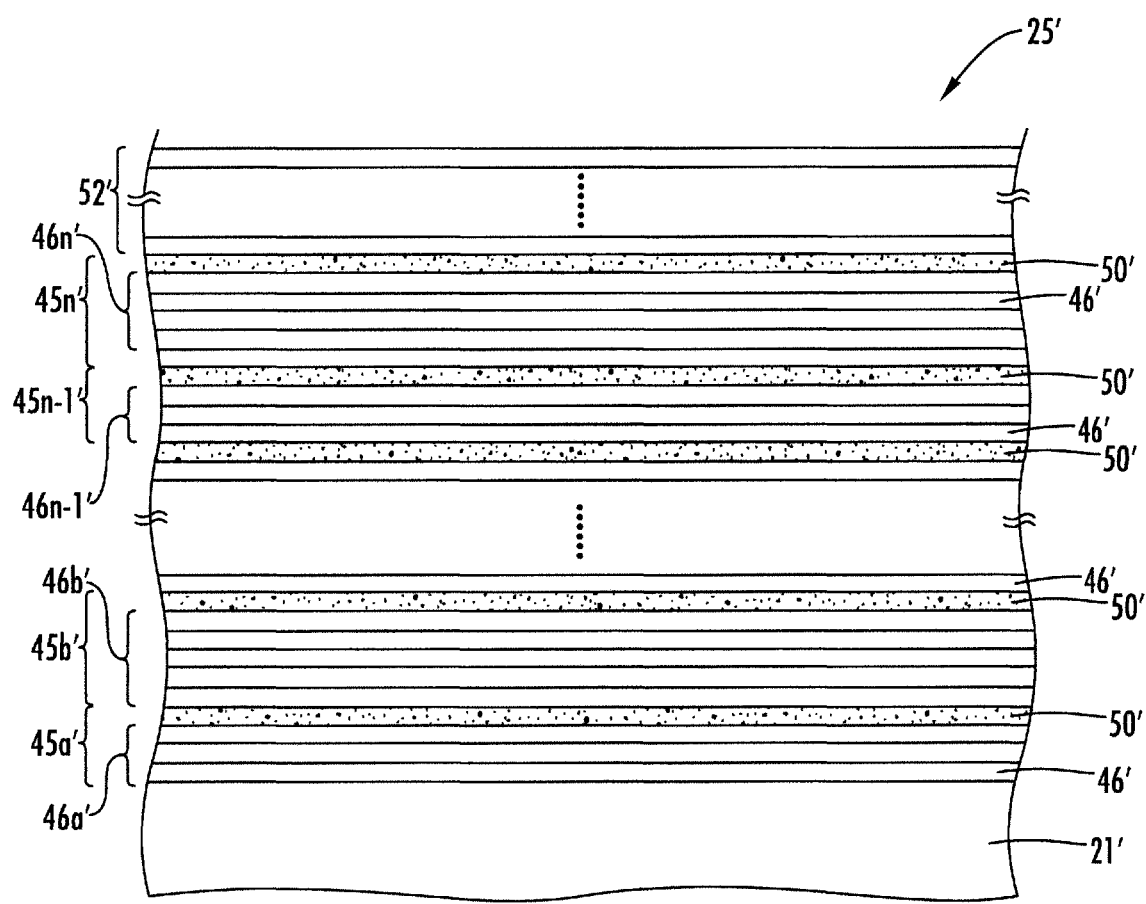
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
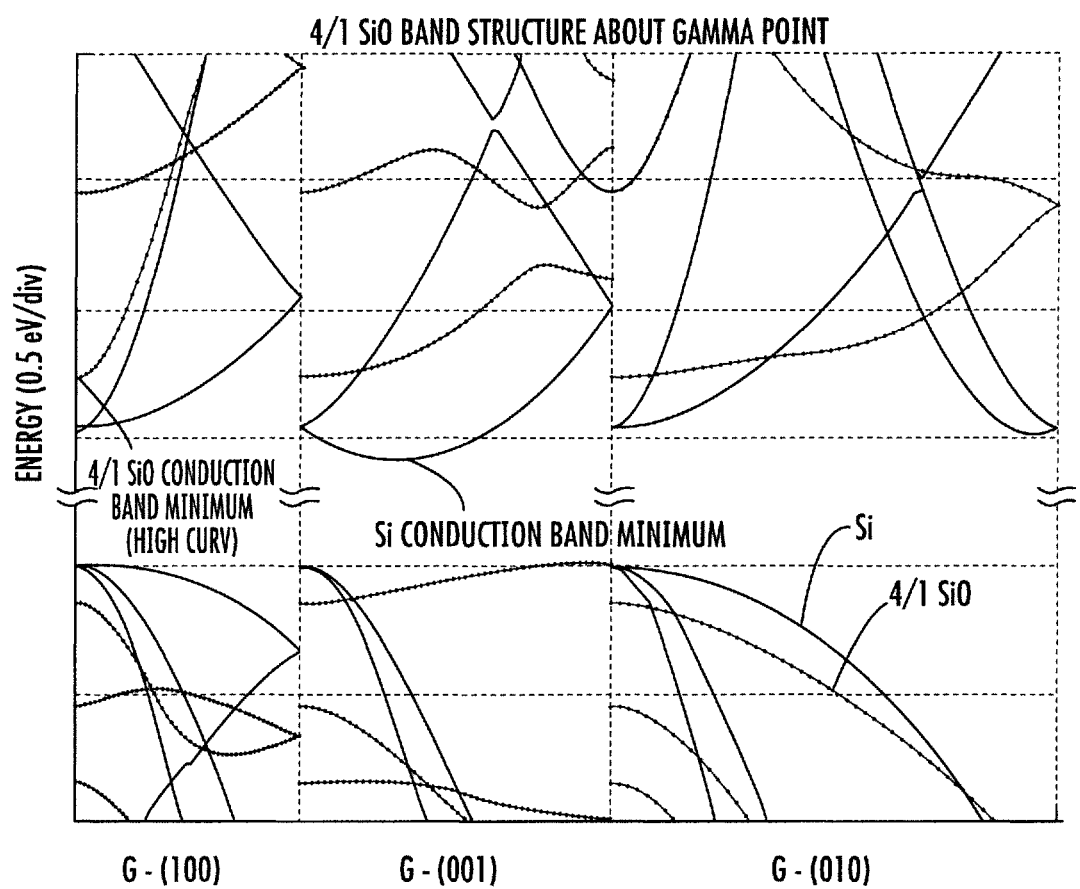
FIG. 4A is a graph of the calculated band structure from the gamma point (G) for both bulk silicon as in the prior art, and for the 4/1 Si/O superlattice as shown in FIGS. 1-2.
Figure 4B:
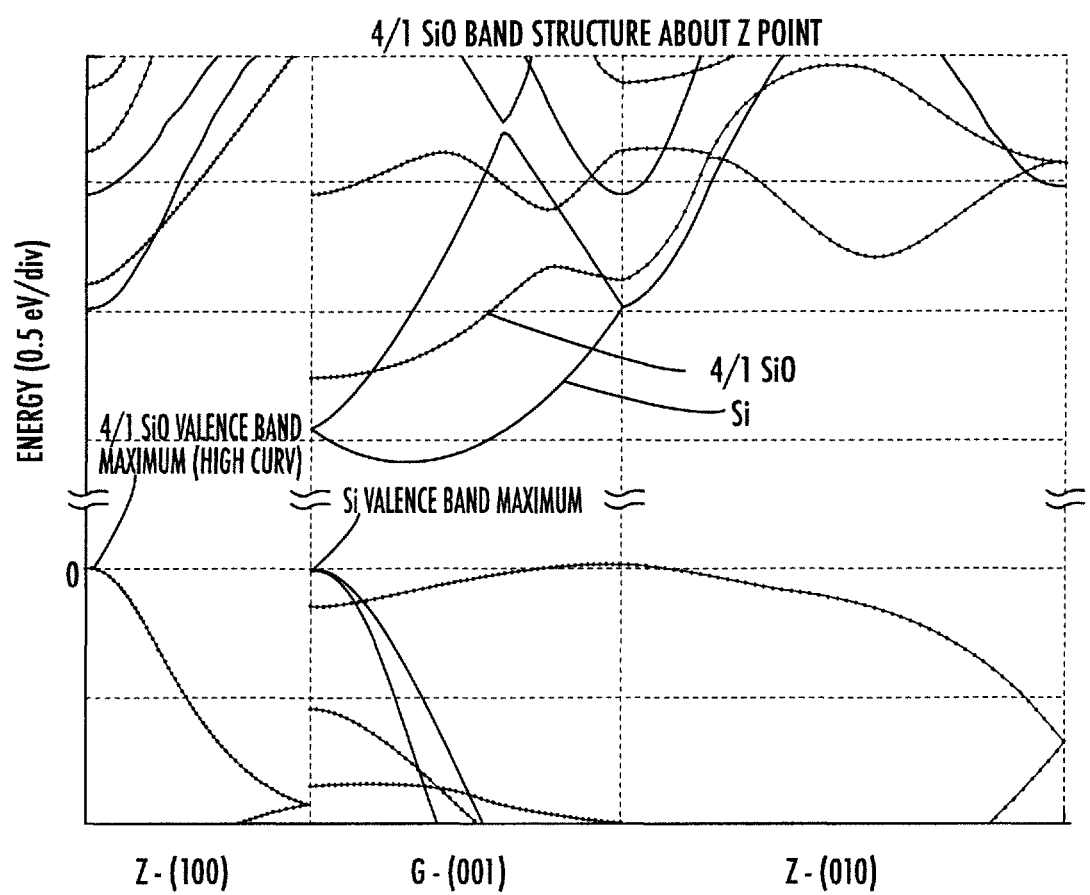
FIG. 4B is a graph of the calculated band structure from the Z point for both bulk silicon as in the prior art, and for the 4/1 Si/O superlattice as shown in FIGS. 1-2.
Figure 4C:
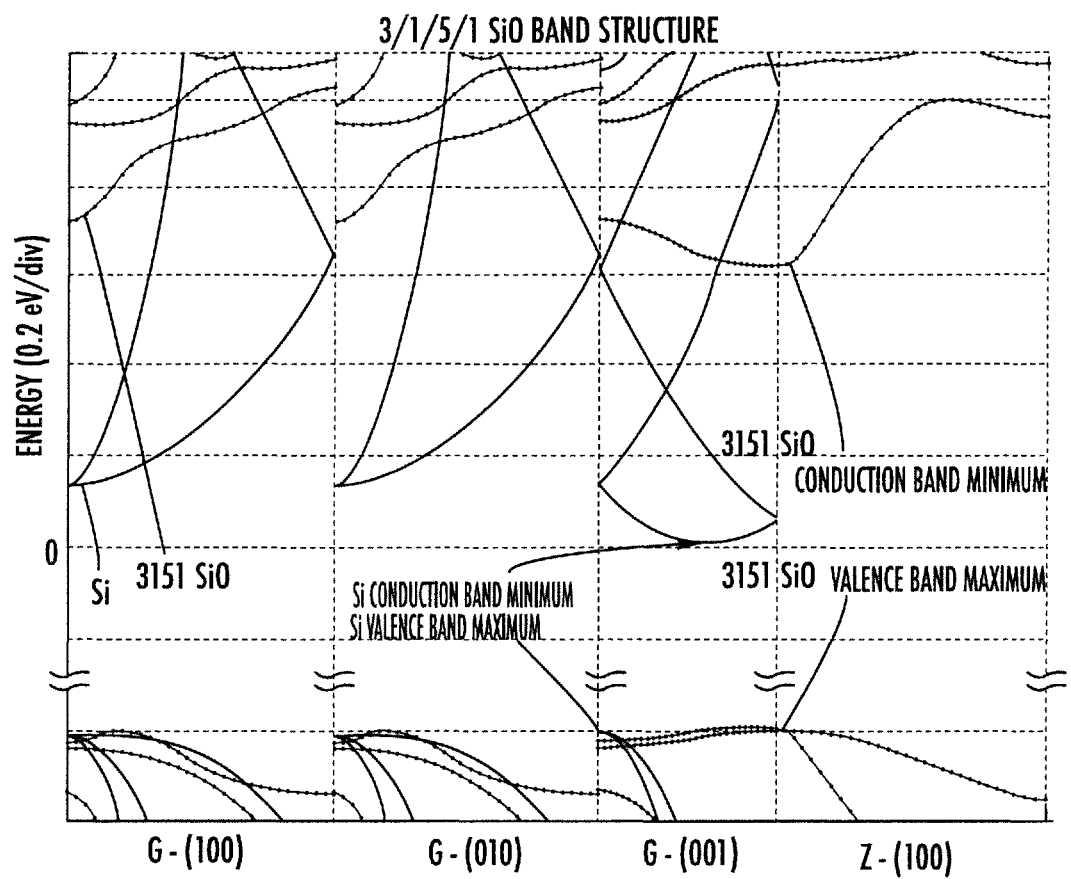
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Using the above-described measures, one can select materials having improved band structures for specific purposes. One such example would be a superlattice 25 material in a semiconductor device, such as a DRAM. One skilled in the art, however, will appreciate that the materials identified herein could be used in many different types of semiconductor devices.

Figure 5:
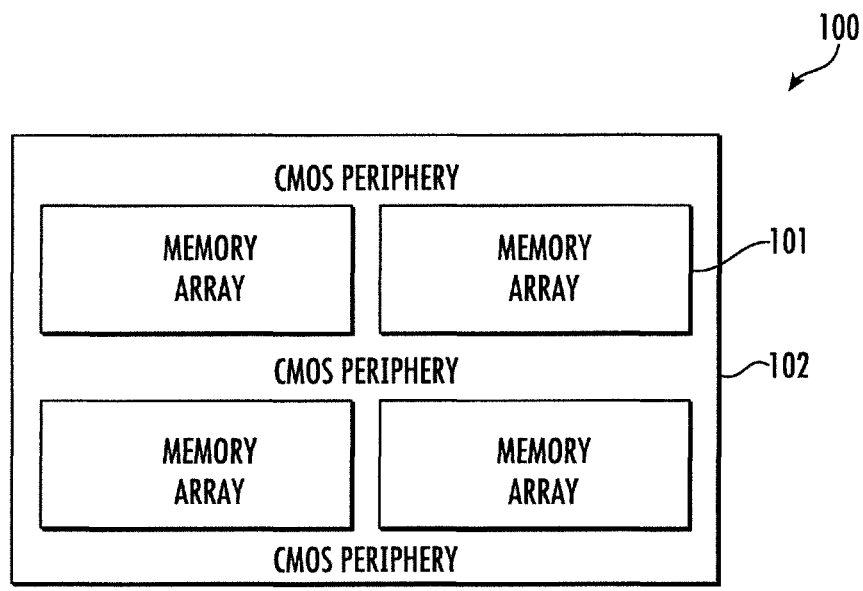
FIG. 5 is a schematic top plan view of a DRAM memory device in accordance with an example embodiment.

Referring initially to FIG. 5, by way of background, DRAM products at the 90-60 nm node or below typically employ a capacitor-on-bitline (COB) cell including a recessed channel array transistor (RCAT) in the DRAM memory array 101, and they use conventional planar transistors in the CMOS periphery 102. That is, such DRAM devices continue to use conventional silicon in the FET channel, for both the periphery CMOS devices 102 and the RCAT devices in the memory array 101, which can result in less than desirable carrier mobility levels and undesirable gate leakage. Further, decreasing DRAM access times and increasing retention times are always important goals, and they become more challenging with each successive technology generation.

Generally speaking, the embodiments discussed herein may advantageously improve DRAM performance by incorporating high-mobility, low-leakage (e.g., silicon-on-silicon) superlattice films into 90 nm-60 nm or other DRAM products that utilize the RCAT FET array 101, and/or conventional planar CMOS FETs in the periphery 102. In the following discussion, the above-described superlattices are also referred to as MST films. Moreover, it should be noted that reference to an MST-1 film deposition is to a blanket deposition of a superlattice across a substrate or wafer, which is then patterned to provide the desired regions or shapes (e.g., as a channel region). Reference to an MST-2 film deposition is to a selective deposition, where the MST film is selectively deposited in the desired location on a substrate or wafer, for example.

As noted above, the MST film advantageously provides high mobility and low gate leakage, which translates into enhanced DRAM performance via improved drivability, and improved reliability via longer retention time. Additionally, due to the fact that the drivability of the RCAT device oriented diagonally on the wafer surface is less than that of an RCAT device oriented straight, the MST film provides an opportunity to improve the drivability of the diagonally-oriented RCAT device, thus giving added flexibility to the DRAM designer to orient the RCAT device in a "non-straight" orientation without unduly sacrificing drivability of the device.

Several example integration schemes to incorporate the MST film into the above-described (or other) DRAM products to thereby enhance DRAM performance are set forth below. The schemes differ in complexity as well as whether the MST film is targeted for CMOS periphery devices only, or additionally the RCAT device in the array. Depending on the specific objectives, the skilled artisan may determine an appropriate scheme or combination/modification thereof.

In accordance with a first example now described with reference to the flow diagram 60 of FIG. 6 and FIGS. 7A, 7E, a superlattice film or layer 125 is incorporated in the channel region of planar CMOS FETs 120 in the periphery of a DRAM device to advantageously help decrease DRAM access time and increase retention time. However, it will be appreciated that the superlattice may also be incorporated in other DRAM and memory technologies as well. See, e.g., U.S. Pat. No. 7,531,850, which is assigned to the present Assignee and is hereby incorporated herein its entirety by reference.

The illustrated approach uses a pre-STI superlattice film deposition for the periphery CMOS FETs 120 (planar) only. Generally speaking, the integration of the superlattice film in planar CMOS devices, prior to STI process steps, with the goals of achieving high mobility channel with reduced gate leakage, has been described in earlier patent applications from the present Assignee, such as U.S. Patent Pub. No. 2006/0267130 and U.S. Pat. No. 7,514,328, which are hereby incorporated herein in their entireties by reference.

Even so, with the use of an RCAT device 140 in the memory array, there are additional integration challenges. This integration scheme overcomes these hurdles, and incorporates the superlattice film in the CMOS periphery only, while keeping the RCAT channel undisturbed in some embodiments.

In this approach, the MST film growth (Block 62) and backside etching (Block 63) occur prior to the STI module (Block 64). As a result, the MST film is exposed to the full thermal cycles of the STI module, with a potential risk of losing some of the band-engineered properties of the film due to diffusion of the non-semiconductor (e.g., oxygen) atoms. To overcome this issue, the STI module has been re-designed with the conventional high-temperature steps replaced with lower temperature process steps. Exemplary changes in the STI module are as follows:

1. After MST film growth on starting wafers, a pad oxide (100 Å) is grown at 850° C. in wet $O_2$ (compared to 150 Å pad oxide at 900° C. in dry $O_2$—i.e., less than 150 Å and less than 900° C.)
2. After STI trench etch, the pad oxide pull-back is reduced to 50 Å, instead of 200 Å (i.e., less than 200 Å).
3. Next, a smoothing anneal at 900° C. or less in hydrogen is incorporated, to round off the top and bottom corners of the STI trench, to provide for a better trench fill.
4. The trench liner process is changed to 100 Å thermal oxide grown at 900° C. in dry $O_2$, as opposed to conventional high-temperature (1000° C.) 180 Å thermal oxide liner processes (i.e., less than 1000° C. and 180 Å). This lower-temperature process is feasible in large part due to the smoothing anneal of step 3 above.
5. High-density plasma (HOP) chemical vapor deposition (CVD) oxide may be used for trench fill, due to its desired fill capabilities, instead of the conventional low pressure CVD (LPCVD) tetraethoxysilane (TEOS) oxide, for example.
6. HDP oxide densification is changed to a low-Dt process, instead of the conventional 1050° C. anneal process (i.e., less than 1050° C.)

Figure 6:
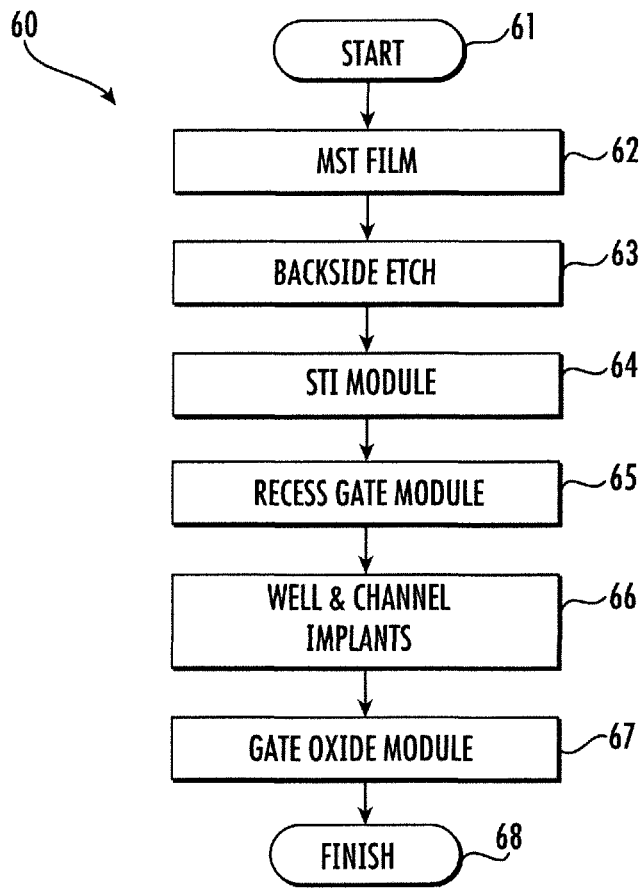
FIG. 6 is a flow diagram illustrating a method for making an example implementation of the DRAM memory device of FIG. 5.

The method further illustratively includes a recess gate module (Block 65), well and channel implantation (Block 66), and a gate oxide module (Block 67), which illustratively concludes the method of FIG. 6.

Figure 7:
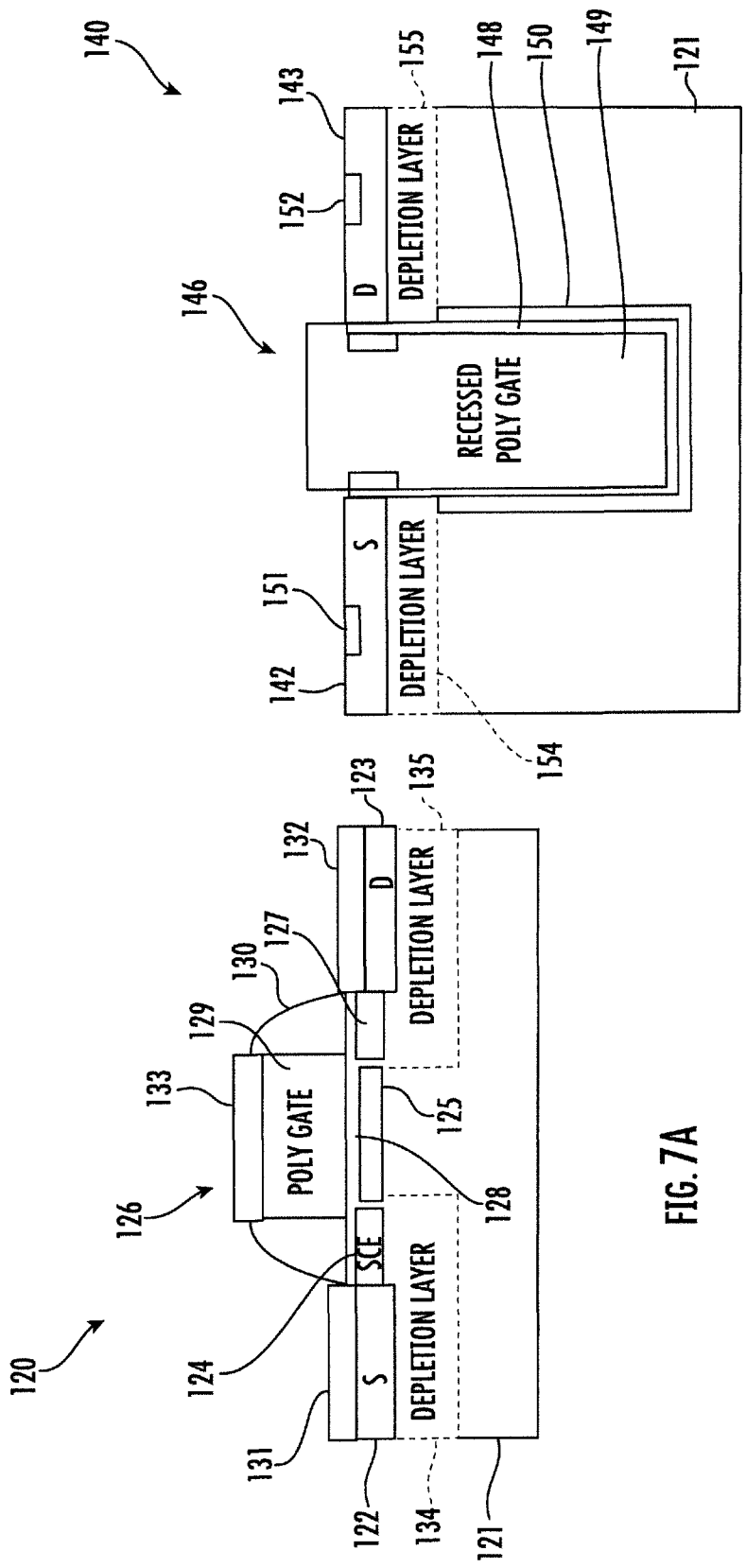
FIG. 7A is a schematic cross-sectional diagram of a CMOS transistor for use in the periphery of the DRAM memory device produced in accordance with the method of FIG. 6.
FIG. 7B is a schematic cross-sectional diagram of an RCAT for use in the memory arrays of the DRAM memory device produced in accordance with the method of FIG. 6.
Figure 8:
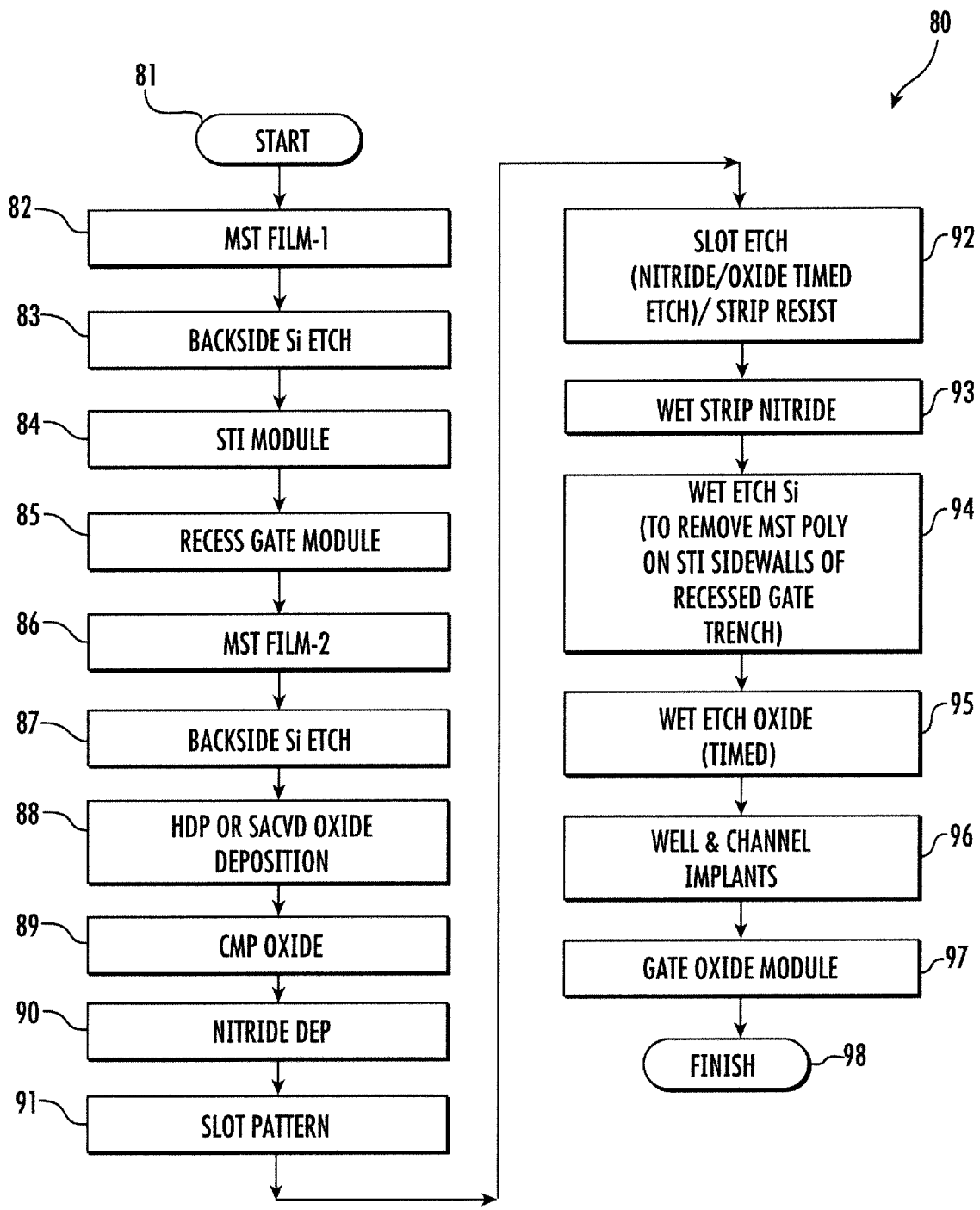
FIG. 8 is a flow diagram illustrating a method for making another example implementation of the DRAM memory device of FIG. 5.
Figure 9:
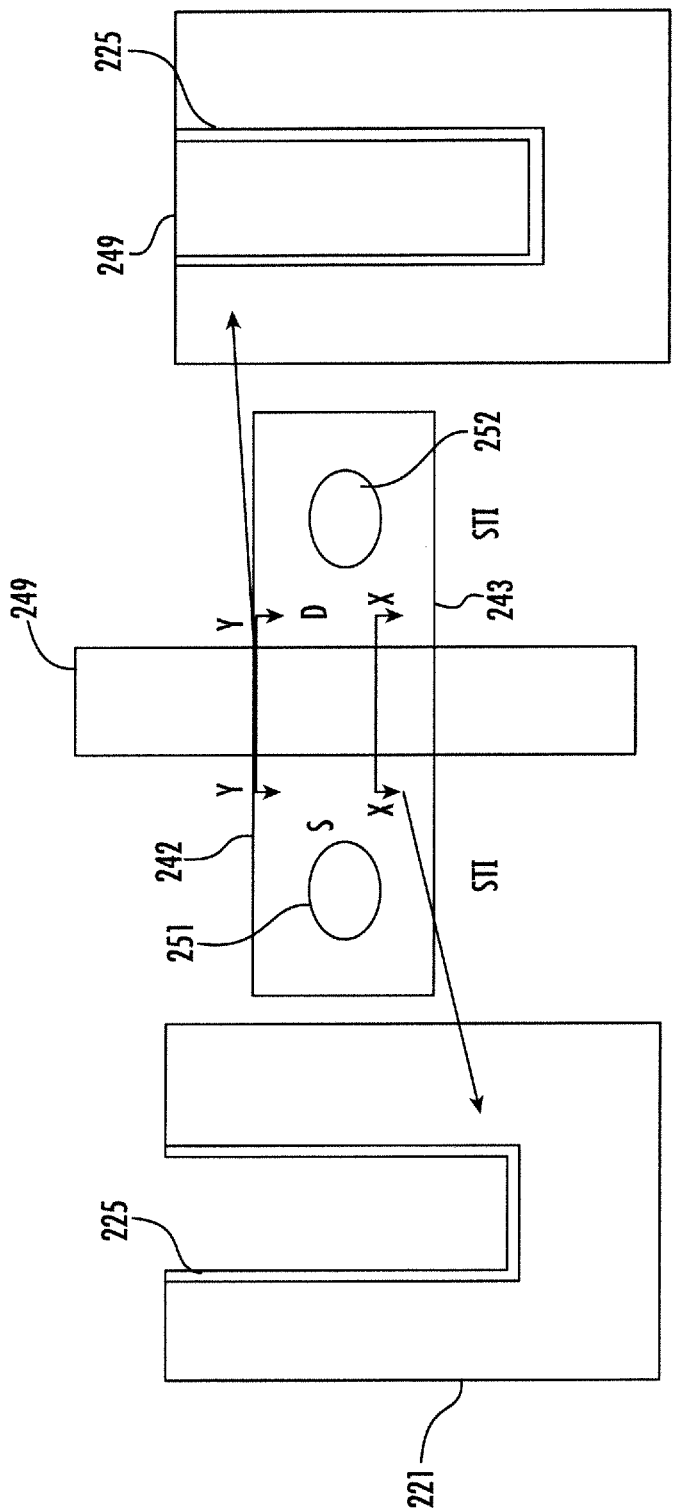
FIG. 9A is a schematic top view of an RCAT for use in the memory arrays of the DRAM memory device produced in accordance with the method of FIG. 8.
FIGS. 9B and 9C are cross-sectional diagrams taken along the lines X-X and Y-Y of FIG. 9A, respectively.

The resulting CMOS transistor 120 in the periphery and the RCAT 140 in the memory array at the completion of this scheme are shown schematically in FIGS. 7A and 7B. At the completion of this scheme, the MST film is in the periphery CMOS device 120 (both NFET and PFET) channel regions only, whereas the RCAT device 140 has a channel in "plain" silicon. An advantage of this scheme is its relative simplicity, and it provides desired enhancements due to the high-mobility, low-gate leakage MST film for the CMOS periphery devices (NFET, and PFET with single, dual or triple gate oxides).

More particularly, the CMOS transistor 120 illustratively includes a substrate 121, source and drain regions 122, 123 and source/drain extensions 124, 127 in the substrate with the superlattice channel 125 therebetween, and a gate 126 including a gate insulator 128 and a polycrystalline gate electrode 129. The CMOS transistor 120 further illustratively includes gate sidewall spacers 130, and respective source, drain, and gate contacts 131, 132, 133. Depletion layers 134, 135 are defined under the source and drain regions 122, 123, respectively.

The RCAT 140 illustratively includes source and drain regions 142, 143 with a recessed gate 146 between the source and drain regions and including a gate insulator 148 and gate electrode 149 (e.g., polysilicon). A channel 150 extends along the sides and bottom of the recessed gate 146 between depletion layers 154, 155 beneath the source and drain regions 142, 143, respectively. A stacked capacitor contact 151 is on the source region 142, and a bitline contact 152 is on the drain region 143. The gate electrode 149 may be coupled to a recessed wordline.

Turning now to the flow diagram 80 of FIG. 8 and FIGS. 9A-12B, a second implementation scheme is described which includes a first pre-STI superlattice film for the periphery CMOS FETs (planar) and a second post-STI superlattice film for the RCAT device, with the use of a "slot mask." Integration of the superlattice film into both planar CMOS devices, as well as into the RCAT device, requires overcoming additional integration challenges, which this scheme addresses by the use of the slot mask. It should be noted that the final CMOS FETs produced by this process will be substantially similar to the one shown in FIG. 7A.

In the present approach, two separate MST films are used. Beginning at Block 81, the first MST film (MST-1) is grown prior to STI formation (Block 82), as described above, for the periphery CMOS devices 120. This film is incidentally removed in the RCAT trenches during the plasma etching of silicon during the formation of these trenches. However, this film stays on in the planar source/drain regions of the RCAT device, without any deleterious consequences. The backside etch (Block 83) and STI module (Block 84) may be performed as described above.

During the RCAT trench silicon etch/gate module (Block 85), the planar surface in the array as well as the periphery is usually protected with a nitride hard mask. The trench silicon etch is usually followed by sacrificial oxidation to oxidize the plasma-damaged silicon on the trench walls. During this thermal oxidation step, planar surface regions in the memory array 101 and periphery 102 are protected with the nitride already present in these regions.

After sacrificial oxidation, a second MST film (MST-2) is grown in the RCAT trenches, at Block 86. A wet pre-clean prior to the MST-2 film growth may be used to remove the sacrificial oxide in the trench. The MST-2 film in the RCAT trench grows on the trench sidewalls as well as on the trench bottom. It should be noted that the RCAT trench has two opposite sidewalls in silicon, whereas the two other sidewalls are bound by STI, as shown in FIGS. 9A-9C. The MST-2 film grows epitaxially on the two silicon sidewalls and the bottom silicon wall (FIG. 9B), whereas it deposits as amorphous film on the two STI oxide sidewalls (FIG. 9C). In addition, the MST film also deposits as an amorphous film on the nitride hard mask on the planar surface in the memory array 101 and periphery 102, and is subsequently removed at a later stage in the process sequence.

If the amorphous MST film on the STI sidewalls is left as-is, it may potentially short the source and drain regions 242, 243 of the RCAT device 240. Hence, this amorphous MST film may be cut off or removed to preserve the isolation between the source and drain regions 242, 243, and at the same time keep the MST film undisturbed on the silicon sidewalls. This is accomplished by the use of the "slot mask" and associated processing.

Figure 10:
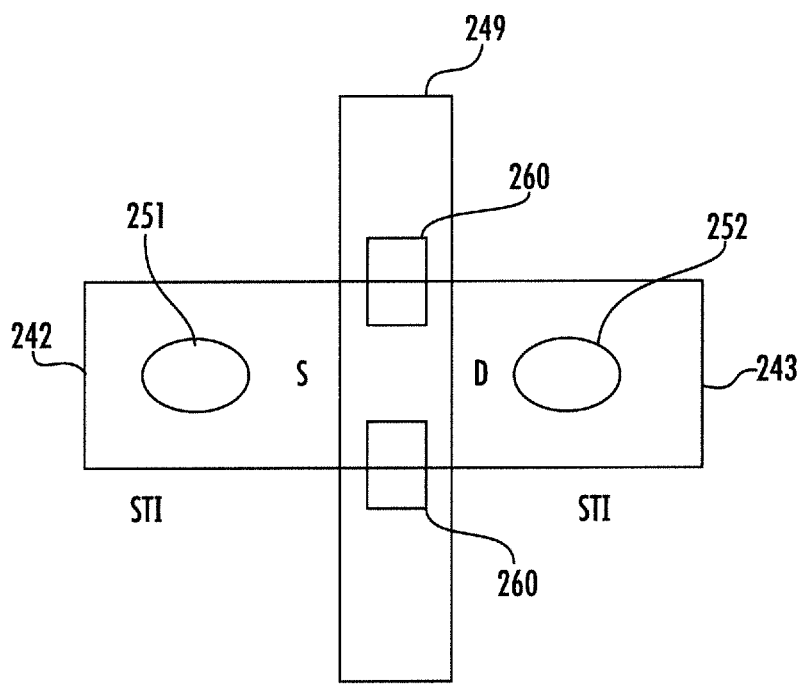
FIG. 10 is a top view of the RCAT of FIG. 9A illustrating the use of slot masks to remove semiconductor material from the RCAT trenches.

The concept of slot mask is schematically shown in FIG. 10. The objective of this mask is to pattern "slot" openings 260 along the RCAT trench, at the intersection of the active area (AA) and STI isolation regions, for removing shorts between source and drain regions 242, 243 caused by amorphous MST film on STI sidewalls of the RCAT trench. There may be several possible designs of the slot, depending on the specific layout of the DRAM cell, but a primary consideration is the slot pattern. Due to limited space available for the slot pattern, requiring it to be nested inside the recessed gate word line, one option is to widen the word line selectively at the location of the placement of the slot. However, there are a few additional steps that may be executed prior to the slot pattern, as outlined above and also described in further detail in the table 261 of FIG. 11.

After MST-2 film growth, a backside etch may be performed (Block 87) followed by an oxide deposition via HDP or subatmospheric CVD (SACVD) (Block 88) of suitable thickness to fill up the trenches, with an optional anneal step to densify the oxide. Then, a CMP operation (Block 89) removes the oxide and underlying MST-2 film on the planar surfaces to stop on nitride. After CMP, an additional nitride (400-500 Å) may be deposited on top of the existing nitride, at Block 90.

At this stage, the slot mask is patterned (which typically requires relatively precise alignment tolerances), at Block 91, followed by plasma oxide etch using the nitride as the hard mask (Block 92). The oxide etch is a timed etch to remove oxide in the slot openings in the trenches, but leaving behind about 200-300 Å of oxide at the bottom of the slots. After the slot etch, the resist is stripped off, followed by a wet strip of the nitride (Block 93).

The next step is a wet silicon etch (Block 94) to remove the amorphous MST-2 film on the STI sidewalls. This is followed by a wet oxide etch (Block 95) to remove the oxide in the trenches and on the planar surface. A thin screen oxide may also be grown inside the trenches as well as on the planar silicon surfaces. At this stage, the normal process flow would continue into the well and channel implant module (Block 96), followed by the gate oxide module (Block 97), etc., which illustratively concludes the method of FIG. 8, at Block 98.

The final output of this sequence of process steps is shown in FIGS. 12A-12B. The portion of the MST-2 amorphous film 249 (defined by the opening in the slot pattern) has been etched from the STI sidewalls of the recessed pass-gate. This would prevent the source drain regions 242, 243 from being shorted laterally near the surface.

Figure 13:
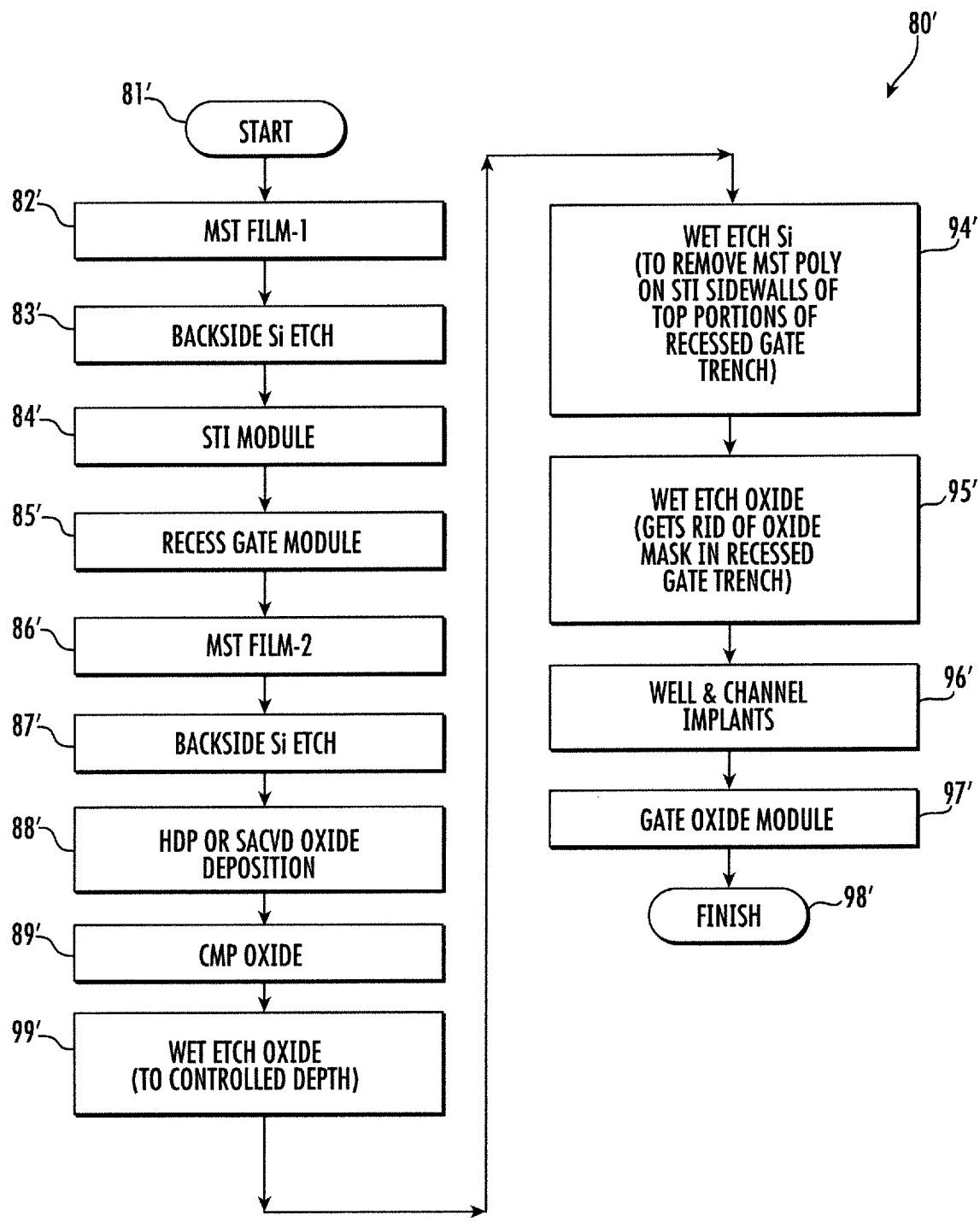
FIG. 13 is a flow diagram illustrating an alternative embodiment of the method of FIG. 8 which does not utilize a slot mask.
Figure 14:
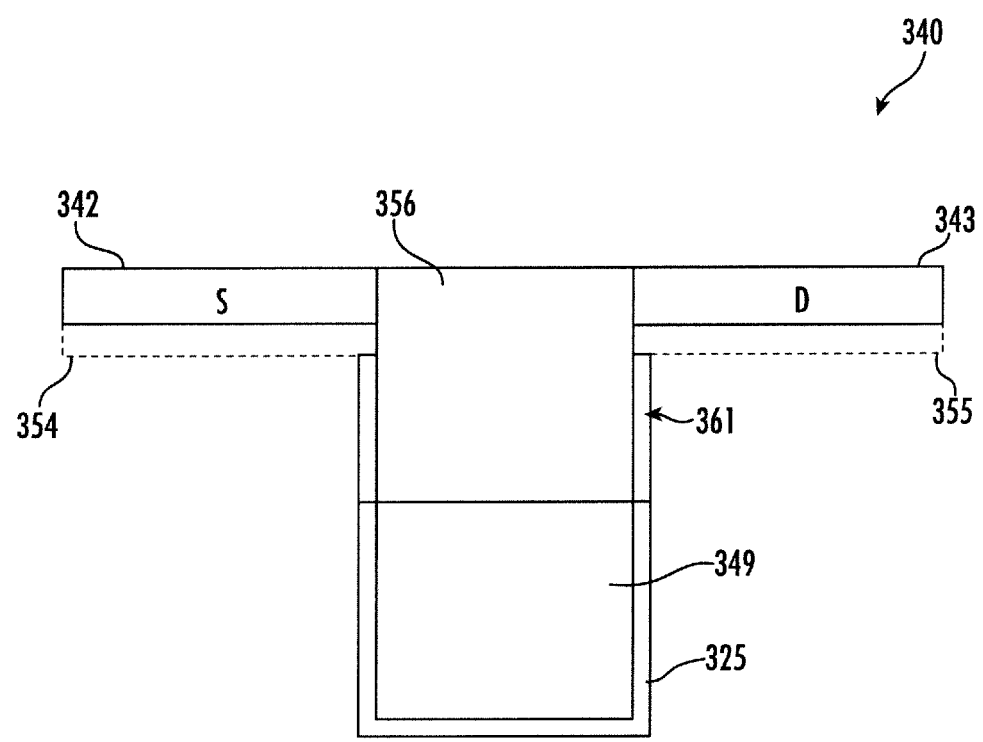
FIG. 14 is a schematic cross-sectional diagram of an RCAT produced using the method of FIG. 13.

Referring additionally to FIG. 14 and the flow diagram 80' of FIG. 13, a third scheme which builds upon the prior scheme, yet without the use of the slot mask (which potentially makes it more "manufacture friendly" in certain applications) is now described. This scheme involves a controlled wet etching of the MST film in the top portion of the RCAT trench (Block 99'), while leaving the MST film intact in the deeper portion of the trench.

As a result, this scheme removes the amorphous MST film on the STI sidewalls of the recessed gate trench to a controlled depth (FIG. 14), but without the use of the slot mask. The depth of this etch is selected to be below the depletion regions 354, 355 of the source/drain regions 342, 343 during active device operation. The resulting high-mobility low-leakage MST film 325 that is left behind is in the deeper regions of the trench along the RCAT channel. However, on the lower regions of the two STI-bound sidewalls of the trench, there is still amorphous MST-2 film 349 left behind. This amorphous MST film 349 will not short the source/drain regions 342, 343 if it is below the depletion regions 354, 355 of the source/drain regions.

Since this parasitic MST 349 on the STI sidewalls is amorphous or polycrystalline, conventional gate oxides grown on this MST polysilicon may be somewhat leaky, in comparison to the oxides grown on epitaxial MST film. However, the use of thicker high-K gate dielectrics may alleviate this problem, since the high-K films are ALD-deposited films. This amorphous MST film 349 at the lower portion of the STI sidewalls may also provide an easier path for carrier transport when the transistor is on, in addition to the usual channel in single-crystal silicon 361 along the sidewalls of the RCAT trench. This additional MST 325 path for carrier transport may significantly enhance the DRAM performance. When the pass-gate transistor is off, this amorphous MST film on the STI sidewalls is isolated from the source/drain regions, thus avoiding a leakage path. An oxide 356 may be deposited to fill the RCAT trench.

Figure 15:
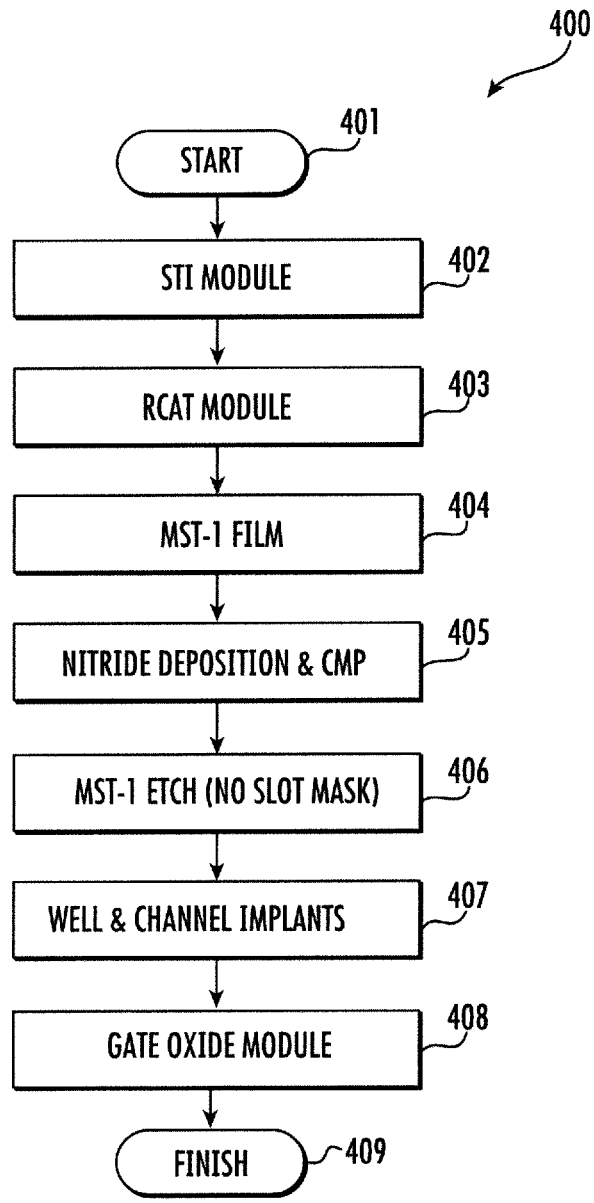
FIG. 15 is a flow diagram illustrating a method for making still another example implementation of the DRAM memory device of FIG. 5.

Still another approach is now described with reference to FIG. 16 and the flow diagram 400 of FIG. 15. Beginning at Block 401, this approach illustratively includes an STI module (Block 402), followed by an RCAT (recessed gate) module (Block 403). A post-STI MST film deposition is performed (Block 404) for the periphery CMOS FETs (planar) and RCAT devices in the memory arrays, with use of a nitride CMP (Block 405) and associated steps. This approach incorporates the superlattice film after STI module processing, without the use of the slot mask, thus potentially making it easier to manufacture in some applications. After the MST film growth, a nitride deposition, followed by nitride CMP (Block 405) and MST etch (Block 406), allows the removal of the MST film from the STI regions, while keeping the superlattice film in the transistor channels. Normal process steps then resume on the wafer, such as a screen oxide growth and well and channel implants (Block 407), followed by gate oxidation (Block 408), etc. At the end of this process scheme, both the CMOS periphery transistors and the RCAT device will have an MST film incorporated in the transistor channels to provide improved performance and reduced gate leakage, and will look similar to those in FIGS. 7A and 14, respectively. The method illustratively concludes at Block 409.

The foregoing will be further understood with reference to an example implementation. In this approach, at the end of the RCAT module, the array (except the RCAT trenches) and periphery have nitride protecting the planar surface. After the RCAT trench etch, a sacrificial oxide is grown to consume the plasma etch damaged silicon on the RCAT trench walls. A wet strip in $H_3PO_4$ may be used to remove nitride on the planar surface. Furthermore, a pre-clean in DHF may be used to remove the sacrificial oxide in the RCAT trenches, as well as the pad oxide on the planar silicon surface.

The MST film may then be grown in the RCAT trenches as well as on planar surfaces in the memory arrays and periphery. A thermal oxide (e.g., 850° C., wet $O_2$, 100 Å) is grown to form pad oxide on the MST film. Furthermore, LPCVD nitride deposition (e.g., 500-750 Å) may be used to selectively remove unwanted MST film. A lithography step ("RCAT pattern") may be used to open up the RCAT trench regions with an over-sized trench mask, while protecting all other regions with resist. An isotropic plasma nitride etch removes the nitride from the RCAT trench walls, while an HDP oxide deposition (~3000 Å) fills up the RCAT trenches, as noted above, followed by a densification anneal.

An oxide CMP step may be included to remove the oxide on planar surfaces, with selectivity to nitride, to stop on nitride. A nitride CMP may be performed with selectivity to oxide. At this stage, the planar surfaces have pad oxide on top of MST film, and the RCAT trenches are filled with HDP oxide on top of the MST film. Next, a controlled wet etch in DHF may be used to remove the pad oxide from the surface, and also remove the HDP oxide in the RCAT trenches to a controlled depth. A wet silicon etch then removes the amorphous MST from the STI sidewalls in the RCAT trenches, and also from STI surfaces in the memory array and periphery. This is then followed by a wet DHF strip to remove the sacrificial oxide in the RCAT trenches, as part of completing the recessed gate module processing. This detailed flow is described further in the table in FIG. 16.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the present disclosure.

That which is claimed is:

1. A method for making a semiconductor device comprising:
   forming at least one memory array comprising a plurality of recessed channel array transistors (RCATs) on a substrate; and
   forming periphery circuitry adjacent the at least one memory array and comprising a plurality of complementary metal oxide (CMOS) transistors on the substrate, each of the CMOS transistors comprising
      spaced-apart source and drain regions in the substrate and defining a channel region therebetween,
      a first superlattice extending between the source and drain regions in the channel region, the first superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and
      a gate over the first superlattice and between the source and drain regions;
   wherein each of the RCATs comprises
      spaced-apart source and drain regions in the substrate,
      a recessed gate in the substrate between the source and drain regions, and
      a second superlattice along bottom and sidewall portions of the recessed gate and defining a channel of the RCAT, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 further comprising forming the second superlattice using a slot mask.

3. The method of claim 1 wherein the second superlattice on the sidewall portions of the recessed gate terminates below the source and drain regions.

4. The method of claim 1 further comprising forming a stacked capacitor contact on the source region of each RCAT.

5. The method of claim 1 further comprising forming a bitline contact on the drain region of each RCAT.

6. The method of claim 1 wherein the at least one memory array comprises a plurality of spaced apart memory arrays; and wherein the periphery circuitry surrounds the plurality of spaced apart memory arrays.

7. The method of claim 1 wherein the base semiconductor monolayers comprise silicon monolayers.

8. The method of claim 1 wherein the at least one non-semiconductor monolayer comprises oxygen.

9. A method for making a semiconductor device comprising:
forming at least one memory array comprising a plurality of recessed channel array transistors (RCATs) on a substrate; and
forming periphery circuitry adjacent the at least one memory array and comprising a plurality of complementary metal oxide (CMOS) transistors on the substrate, each of the CMOS transistors comprising
spaced-apart source and drain regions in the substrate and defining a channel region therebetween,
a first superlattice extending between the source and drain regions in the channel region, the first superlattice comprising a plurality of stacked groups of layers, each group of layers comprising a plurality of stacked base silicon monolayers defining a base silicon portion, and at least one oxygen monolayer constrained within a crystal lattice of adjacent base silicon portions, and
a gate over the first superlattice and between the source and drain regions;
each of the RCATs comprising
spaced-apart source and drain regions in the substrate;
a recessed gate in the substrate between the source and drain regions; and
a second superlattice along bottom and sidewall portions of the recessed gate and defining a channel of the RCAT, the second superlattice comprising a plurality of stacked groups of layers, each group of layers comprising a plurality of stacked base silicon monolayers defining a base silicon portion, and at least one oxygen monolayer constrained within a crystal lattice of adjacent base silicon portions.

10. The method of claim 9 further comprising forming the second superlattice using a slot mask.

11. The method of claim 9 wherein the second superlattice on the sidewall portions of the recessed gate terminates below the source and drain regions.

12. The method of claim 9 further comprising forming a stacked capacitor contact on the source region of each RCAT.

13. The method of claim 9 further comprising forming a bitline contact on the drain region of each RCAT.

14. The method of claim 9 wherein the at least one memory array comprises a plurality of spaced apart memory arrays; and wherein the periphery circuitry surrounds the plurality of spaced apart memory arrays.

15. A method for making a semiconductor device comprising:
forming a plurality of memory arrays each comprising a plurality of recessed channel array transistors (RCATs) on a substrate; and
forming periphery circuitry adjacent the plurality of memory arrays and comprising a plurality of complementary metal oxide (CMOS) transistors on the substrate, each of the CMOS transistors comprising
spaced-apart source and drain regions in the substrate and defining a channel region therebetween,
a first superlattice extending between the source and drain regions in the channel region, the first superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and
a gate over the first superlattice and between the source and drain regions;
each of the RCATs comprising
spaced-apart source and drain regions in the substrate,
a recessed gate in the substrate between the source and drain regions, and
a second superlattice along bottom and sidewall portions of the recessed gate and defining a channel of the RCAT, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

16. The method of claim 15 further comprising forming the second superlattice using a slot mask.

17. The method of claim 15 wherein the second superlattice on the sidewall portions of the recessed gate terminates below the source and drain regions.

18. The method of claim 15 further comprising forming a stacked capacitor contact on the source region of each RCAT.

19. The method of claim 15 further comprising forming a bitline contact on the drain region of each RCAT.

20. The method of claim 15 wherein the periphery circuitry surrounds the plurality of spaced apart memory arrays.

21. The method of claim 15 wherein the base semiconductor monolayers comprise silicon monolayers.

22. The method of claim 15 wherein the at least one non-semiconductor monolayer comprises oxygen.

23. A method for making a semiconductor device comprising:
forming a plurality of spaced-apart memory arrays comprising a plurality of recessed channel array transistors (RCATs) on a substrate; and
forming periphery circuitry surrounding the plurality of spaced apart memory arrays and comprising a plurality of complementary metal oxide (CMOS) transistors on the substrate, each of the CMOS transistors comprising
spaced-apart source and drain regions in the substrate and defining a channel region therebetween,
a first superlattice extending between the source and drain regions in the channel region, the first superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and
a gate over the first superlattice and between the source and drain regions.

24. The method of claim 23 wherein the base semiconductor monolayers comprise silicon monolayers.

25. The method of claim 23 wherein the at least one non-semiconductor monolayer comprises oxygen.

* * * * *